United States Patent [19]
Gontowski, Jr.

[11] 3,822,386
[45] July 2, 1974

[54] NOISE IMMUNE TRANSISTOR SWITCH

[75] Inventor: Walter S. Gontowski, Jr., North Grosvenordale, Conn.

[73] Assignee: Sprague Electric Company, North Adams, Mass.

[22] Filed: Apr. 4, 1973

[21] Appl. No.: 347,987

[52] U.S. Cl. ............. 307/247, 307/247 A, 307/235, 307/255
[51] Int. Cl. ............ H03k 17/00
[58] Field of Search ........ 307/247 A, 235, 255, 249

[56] References Cited
UNITED STATES PATENTS
3,684,898 8/1972 Wood ............ 307/255
3,735,153 5/1973 Shukla ............ 307/254

*Primary Examiner*—Rudolph V. Rolinec
*Assistant Examiner*—B. P. Davis
*Attorney, Agent, or Firm*—Connolly & Hutz

[57] ABSTRACT

A PNP and an NPN transistor are combined with a few resistors to form a buffer switch that is particularly useful for interfacing transistor logic circuits with remote mechanical switches in a high noise environment. Noise voltages that may be generated in chassis or common ground circuits leading to the logic inputs, must reach a level almost as large as the switching circuit power supply voltage, to cause abnormal switching.

7 Claims, 2 Drawing Figures

NOISE IMMUNE TRANSISTOR SWITCH

BACKGROUND OF THE INVENTION

This invention relates to switching circuits having high switching thresholds. The switching thresholds of typical CMOS circuits may be half of the power supply voltage while for TTL and DTL logic devices, 1.5 volts is typical. Guaranteed thresholds against hard noise sources is usually much less.

High threshold circuits are made which employ a zener voltage reference. Zener diodes in integrated circuit form may have a voltage of about 6.50 but a wide range of voltages is not easily realized. Circuits employing zener diodes and the like to achieve a high threshold to noise, usually provide a fixed threshold such that when the power supply voltage varies the input signal voltage amplitude or input impedance range for which legitimate switching will occur also varies. This feature can seriously limit the versatility and usefulness of such circuits. Also, such circuits tend to be complicated and therefore expensive.

When it is necessary or desirable to connect a remote mechanical switch to the input of a normal transistor logic circuit, noise generated in the conductors between the closed switch and the logic circuit may give false or anomalous triggering. This is particularly true when a common chassis ground is used as one of the connecting paths between the mechanical switch and the logic circuit. Other electrical circuits sharing the same common chassis ground path may generate large noise transients in this ground system. Such common ground systems are found in automobiles, aircraft, and factories. Electronic monitoring or control circuits dealing with small signals are particularly vulnerable to ground noise in such environments where large motors, relays and other relatively heavy machinery is used nearby.

It is therefore an object of this invention to provide a switching circuit having a high noise immunity, and low cost.

It is a further object of this invention to provide a switching circuit having a high threshold to input noise voltages which threshold varies with the supply voltage such that legitimate input signals will be assured of effecting legitimate switching.

It is a further object of this invention to provide a logic switching circuit that may be incorporated in an integrated logic circuit.

SUMMARY OF THE INVENTION

The switching circuit of this invention employs a PNP and an NPN transistor wherein the collector of one supplies the base current to the other. A switch closure between the base of the first transistor and the circuit ground, causes this first transistor to conduct thus providing base current to the second transistor and causing the second to become conductive. Voltage transients existing in the connections between the switch and the first transistor may have a polarity the same as the power supply and a magnitude as great as that of the power supply minus one $V_{BE}$ and still not initiate anomalous switching. Thus high immunity to noise in the input conductors is achieved by a simple low cost circuit.

DESCRIPTION OF THE PREFERRED EMBODIMENT

Figure 1:
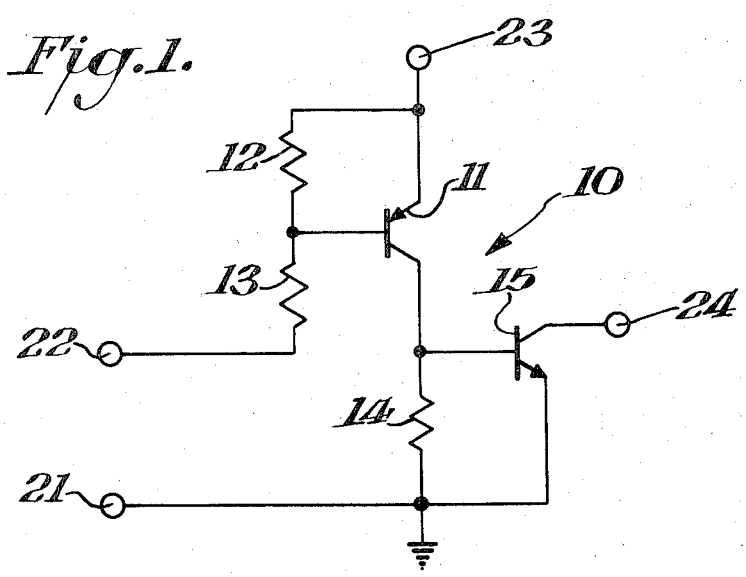
FIG. 1 shows a switching circuit of a first preferred embodiment of this invention.

In FIG. 1 is shown a first preferred embodiment of a switching circuit 10 of the present invention. The emitter of the bipolar PNP transistor 11 is directly connected to power supply terminal 23. A resistor 12 is connected between the emitter and the base of transistor 11. Another resistor 13 is connected between input terminal 22 and the base of transistor 11. Connected between the collector of transistor 11 and the circuit ground terminal 21 is a third resistor 14. A second bipolar transistor, being an NPN type, has its emitter connected to ground terminal 21, its base being connected to the collector of the first transistor 11, and its collector being connected to output terminal 24. A d.c. power supply (not shown) is connected to the circuit with its positive lead at terminal 23 and negative lead at terminal 21. Terminal 21 will be referred to herein as the circuit ground point, such that signals at the input terminal 22 and output terminal 24 are spoken of with reference to terminal 21, or ground. Whether or not terminal 21 is actually grounded is of course immaterial. The power supply terminal 23, may be called the "hot" terminal as distinguished from the ground terminal 21.

When a live load is connected to the output which causes a positive potential to appear at terminal 24, the transistor 15 is conducting, for the condition that transistor 11 is conducting. When transistor 11 is cut off, transistor 15 is also cut off. Further, it can be seen that transistor 11 will be cut off when the input terminals 22 and 21 are open, since no current flows in resistor 12, and the base to emitter voltage of transistor 11 is essentially zero. Now, if a variable resistor is connected between the input terminals 22 and 21 and its value is decreased, current begins to increase through resistors 12 and 13 and when the voltage across resistor 12 reaches about 0.7 volts ($V_{BE}$), transistor 11 begins to conduct and transistor 15 also becomes conductive. This particular input impedance, $R_T$, is called the threshold resistance. For any lower value of input resistance both transistors continue to conduct. The symbol $V_{BE}$ designates the voltage drop between the base and emitter of a conducting transistor, which for a silicon transistor is about 0.7 volts. The symbol $V_{cc}$ will be used to designate the magnitude of the power supply voltage.

Letting the values of the power supply voltage, and resistors 12 and 13 be $V_{cc}$, $R_{12}$, and $R_{13}$ respectively $$R_T = V_{cc} - V_{BE}/V_{BE}\, R_{12} - R_{13}$$

Now consider a voltage that is rising positively at input terminal 22 relative to the ground terminal 21. The current in resistor 13 decreases accordingly, and when it reaches the current value for which the same current in resistor 12 produces a voltage $V_{BE}$ across resistor 12, then the transistor 11 is on the threshold of cutting off. The said input voltage at this instant has a value that may be designated $V_T$, the input threshold voltage of the circuit.

Thus:

$$V_{cc} - V_{BE} - V_T/R_{13} = V_{BE}/R_{12} \text{ and}$$

$$V_T = V_{cc} - V_{BE}\,(1 + R_{13}/R_{12}).$$

The very same variables that determine the input resistance threshold $R_T$ are seen to be the same ones that determine the input voltage threshold $V_T$.

Thus a mechanical switch connected across the input terminals 22 and 21 can typically have a resistance of a few hundred ohms in the closed condition and still cause the switching circuit to switch. This switch, however, offers a more important advantage, namely immunity from noise voltage that may be inadvertently and anomalously generated in the wiring between the circuit input and the aforementioned switch. When the mechanical switch is closed, such noise may cause terminal 22 to go positive, namely in the direction to shut off transistor 11 and thus transistor 15. To do so, however, the positive noise voltage must equal or exceed the value $V_{cc} - V_{BE}$, when the value of resistor 13 is zero. Thus the circuit is capable of providing a very high voltage threshold to noise. This noise threshold voltage is reduced when resistor 13 is not zero. When resistors 12 and 13 have the same value a positive noise voltage must exceed about $(V_{cc} - 2V_{BE})$ before the switch conduction is interrupted.

Thus the voltage threshold of this circuit can be nearly as large as the power supply voltage itself. As the power supply voltage varies, the threshold varies so as to preserve a constant difference between them. The circuit always ceases to conduct when its input is open circuited. The circuit is therefore seen to be almost ideally suited as an interface circuit between sensitive transistor logic systems and binary inputs derived from mechanical switch circuits having potentially large voltage noise signals generated therein.

Figure 2:
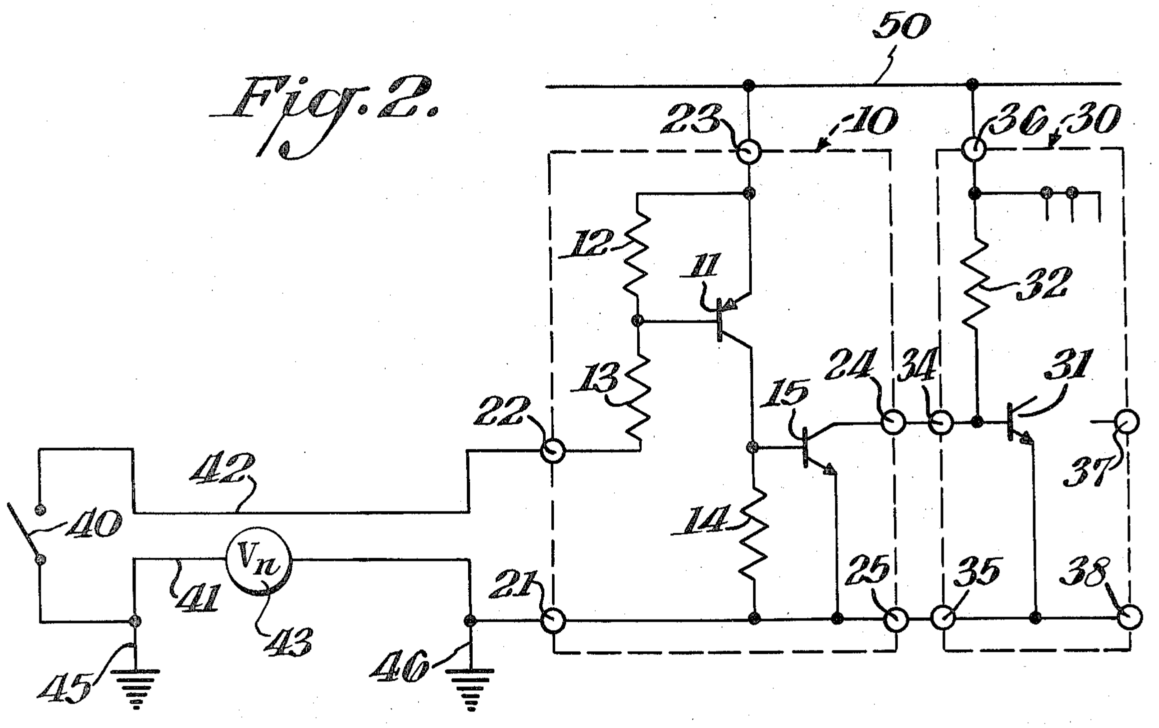
FIG. 2 shows a switching circuit of a second preferred embodiment of this invention.

In FIG. 2 is shown the circuit 10 of FIG. 1, with a single pole single throw switch 40 connected by means of conductors 41 and 42 to input terminals 21 and 22 respectively.

A voltage generator 43 is shown in series with ground conductor 41, symbolizing the aforementioned noise source. Such noises commonly occur when lead wires are long, and are especially prevalent when a common chassis type ground is used as the conductor 41.

The output terminals 24 and 25 of the switching circuit 10 are shown connected to the input terminals 34 and 34 respectively of a typical logic circuit 30 whose first stage transistor 31 has its emitter tied to ground, and its base connected to terminal 34 and being biased positively through a resistor 32 to power supply terminal 36. The logic circuit 30 has output terminals designated 37 and 38. Power supply buss 50 is positive and connects to terminals 23 and 26. The complete circuit of FIG. 2 represents a second preferred embodiment of the present invention.

With the mechanical switch 40 open, the switching circuit 10 is not conducting, the base of transistor 31 is urged toward the power supply voltage by connection through resistor 32 and transistor 31 is made conductive. When switch 40 closes, switching circuit 10 conducts, the voltage at terminal 24 drops to about 0.2 volts and transistor 31 is cut off.

It is apparent that the dual of the circuits shown in FIGS. 1 and 2, wherein transistor 11 becomes an NPN, transistor 15 becomes a PNP, and the power supply voltage has the reverse polarity, is an equally effective high noise threshold circuit.

In a prototype of the second preferred embodiment, circuits 10 and 30 are made on an integrated silicon circuit by a conventional process. The transistors are formed in epitaxial silicon of 1 ohm-centimeter resistivity and thickness of about 10 microns. The current gain, $\beta$, is from 20 to 200 at 100 microamperes of collector current for NPN transistors. The corresponding figures for the PNP transistors' $\beta$ is 2 to 50 at 50 microamperes. $BV_{ceo}$ is greater than 6 volts for all transistors. The circuit used a 6 volt power supply. Resistors 12, 13, 14, and 32 are all 5,000 ohms and are formed by a so-called normal base diffusion process.

The transistors and resistors are readily made in integrated circuit form, and the circuit is realized by a surprisingly simple combination of a few standard broad tolerance components. For these reasons this circuit represents a low cost solution to the problem of noise rejection from remote mechanical switch input circuits to transistor logic controls and monitors.

What is claimed is:

1. A switching circuit comprising:

two power supply terminals for connection to an external d.c. voltage, one said power supply terminal being the circuit ground reference terminal and the other said power supply terminal being the hot terminal;

a first and second bipolar transistor, being of opposite types, the emitter of said first transistor being connected to said hot terminal, the emitter of said second transistor being connected to said ground terminal, and the collectors of said first transistor being connected to the base of said second transistor;

a first resistor connected between said ground terminal and said base of said second transistor;

a second resistor connected between the base of said first transistor and said hot terminal;

a third resistor connected between said base of said first transistor and an input terminal, said transistors and said resistors having been made by a normal silicon integrated circuit process;

a remote mechanical switch connected between said input terminal and said ground terminal; and output means being connected to the collector of said second transistor.

2. The circuit of claim 1 wherein said first transistor is a PNP type.

3. The circuit of claim 1 wherein said first transistor is an NPN type.

4. The circuit of claim 1 having a noise voltage source effectively in series with said mechanical switch.

5. The circuit of claim 1 wherein said third resistor has a value that is essentially zero.

6. The circuit of claim 1 wherein said output means consists in an output terminal.

7. The circuit of claim 1 wherein said output means is comprised of a third transistor of the same type as said second transistor, the emitter of said third transistor being connected to said ground terminal; and a resistor connected between said hot terminal and the base of said third transistor; wherein said connection between said collector of said second transistor and said output means is achieved by connecting said collector of said second transistor to said base of said third transistor.

* * * * *